(12) United States Patent
Oyamatsu

(10) Patent No.: US 6,768,182 B2
(45) Date of Patent: Jul. 27, 2004

(54) SEMICONDUCTOR DEVICE

(75) Inventor: Hisato Oyamatsu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/917,775

(22) Filed: Jul. 31, 2001

(65) Prior Publication Data

US 2002/0024112 A1 Feb. 28, 2002

(30) Foreign Application Priority Data

Jul. 31, 2000  (JP) .................................... 2000-232115

(51) Int. Cl.[7] .......................... H01L 29/00; H01L 29/11
(52) U.S. Cl. .................. 257/506; 257/510; 257/903
(58) Field of Search ............................. 257/204–206, 257/369, 501, 506, 510, 511, 379–381, 903–907, 69

(56) References Cited

U.S. PATENT DOCUMENTS 5,930,163 A  *  7/1999  Hara et al. ................. 365/154
6,020,616 A      2/2000  Bothra et al.
6,091,630 A  *  7/2000  Chan et al. ................. 365/156
6,118,158 A  *  9/2000  Kim .......................... 257/369
6,175,138 B1 *  1/2001  Noda ......................... 257/392
6,252,280 B1 *  6/2001  Hirano ....................... 257/347

FOREIGN PATENT DOCUMENTS

JP           11-195702           7/1999

* cited by examiner

Primary Examiner—Shouxiang Hu
(74) Attorney, Agent, or Firm—Banner & Witcoff Ltd.

(57) ABSTRACT

A semiconductor device, which is capable of improving isolation property of an isolation structure using STI without increasing impurity concentrations of wells, includes a well isolation structure in form of a shallow trench formed on the boundary between first and second wells opposite in conductivity type and adjacent to each other. When a first device region formed in the first well and a second device region formed in the second well are opposed at opposite sides of the well isolation structure, they are disposed at a first width (well isolation distance) than the second width when they are not opposed to each other. One of the device regions may be a dummy region which does not function as a circuit. In this configuration, angle of STI side walls is steeper, and STI width can be made smaller.

3 Claims, 11 Drawing Sheets

SEMICONDUCTOR DEVICE

CROSS REFERENCE TO RELATED APPLICATION

This application is based upon and claims the benefit of priority from the prior Japanese Patent Application No. 2000-232115, filed on Jul. 31, 2000; the entire contents of which are incorporated herein by reference.

BACKGROUND OF THE INVENTION

This invention relates to a semiconductor device and, more particularly, to shallow trench isolation (STI) that is a technique using a shallow trench for isolation of device regions.

Semiconductor devices are moving on toward miniaturization and high integration to meet the requirements of lower power consumption, higher function and higher performance. In accordance with such movements, miniaturization processes have been developed, and they are contributing to improvements of device performance and progresses of LSI toward higher function and higher performance by high integration. Among miniaturization techniques, those for shorter wavelengths of light in lithography and progress of very high resolution techniques such as phase shifting for compensating shorter wavelengths are especially remarkable.

In contrast, regarding device isolation structures, there was a change in applied process upon the 0.25 μm process generation as a boundary. That is, although LOCOS employing selective oxidation process was conventionally used, device structure has been moved to STI (shallow trench isolation) intended for more miniaturization since the 0.25 μm process generation. STI is a technique of obtaining a device isolation structure by first making a shallow trench at a surface part of a Si substrate through a micro process and then filling an insulating film therein.

FIGS. 9A and 9B show cross-sectional structures of typical STIs. These structures include an insulator 12 filled in a trench 11 formed along a surface part of a substrate 10, and a boundary between a p-well 13 and an n-well 14 is positioned immediately under STI.

In case of FIG. 9A, an n$^+$diffusion layer 15, which is a device region, is formed on the surface part of the p-well 13, but no device region exists in the opposite position in the n-well side. This is called an open space.

In FIG. 9B, however, an n$^+$diffusion layer 15 is formed as the device region on the surface part of the p-well 13, and a p$^+$diffusion layer 16 is also formed as a device region on the surface part of the n-well 14 in the opposite position. This is called a narrow space.

In case of the narrow space, the tapered angle of the wide wall of the trench 11' is steeper than that in case of the open space as shown in FIG. 9B. It is generally assumed that this is a result of a loading effect.

In the explanation below, distance between the trench end position and the boundary of the well is defined as the well boundary distance, and distance between isolated device regions is defined as the well isolation distance. The well isolation distance is equal to the width of STI.

FIG. 10 is a graph that shows relations between the width of STI and the tapered angle in a device where each device region is formed inside a well to be isolated. According to this graph, as the width of STI decreases, the tapered angle tends to become steeper. This is because etching products that will form the etching protective film adhere onto side walls of the region to be etched during RIE (reactive ion etching) for making the trench and the quantity of the etching products changes with the area of the region to be etched.

If the tapered angle of the trench wide wall becomes steeper, then the leak path extending from the device region 16 along the side surface 12a and the bottom surface 12b of the trench to the p-well 13 (creepage distance) becomes longer as shown in FIG. 11.

FIGS. 12A and 12B show results of an experiment in actual formation of devices. FIG. 11A shows those of devices in which device regions are not opposed whereas FIG. 12B shows those of devices in which device regions are opposed. This result shows that, in devices where device regions are not opposed, the withstand voltage property decreases to an unusable level when the STI width reaches 0.2 μm, but in devices where device regions are opposed, they maintains a sufficient withstand voltage even under 0.2 μm.

Thus, in LSI having a STI structure, the tapered angle of the trench side wall is steeper in case of a narrow space as compared with the case of an open space.

On the other hand, well isolation property in LSI depends on how effectively isolated are devices on the STI side surface, bottom surface and Si surface. Therefore, in miniaturization of LSI, integrated circuits designed and disposed in various modes have to be designed on the basis of a result of the open space, and this is a serious disadvantage in terms of miniaturization.

To improve the well isolation property, it is impurity concentration of the well may be increased, in general. However, although the isolation property is certainly improved, there arises another problem that the junction capacitance increases and adversely affects from the viewpoint of high-speed operation.

SUMMARY OF THE INVENTION

A semiconductor device according to an embodiment of the present invention comprises:
first and second wells opposite in conductivity type and adjacent to each other;
a well isolation structure in form of a shallow trench formed on the boundary of said first and second wells, said well isolation structure having a first width and a second width larger than the first isolation width;
a first device region provided in said first well; and
a second device region provided in said second well, wherein said first and second device regions are provided so as to be opposed at said first width of said well isolation structure and wherein said first and second device regions do not meet facing at said second width of said well isolation structure.

A method of manufacturing semiconductor device comprises:
forming a first well of a first conductivity and a second well of a second conductivity which is opposite to the first conductivity in a manner they are disposed adjacent to each other;
forming a well isolation structure in a form of a shallow trench on the boundary of said first and second wells, said well isolation structure having a first width and a second width which is larger than the first width;
forming a first device region in said first well; and
forming a second device region provided in said second well, wherein said first and second device regions are provided so as to be opposed at said first width of the well isolation structure and wherein said first and second device regions do not meet facing at the second width of said well isolation structure.

DETAILED DESCRIPTION OF THE INVENTION

Figure 9A:
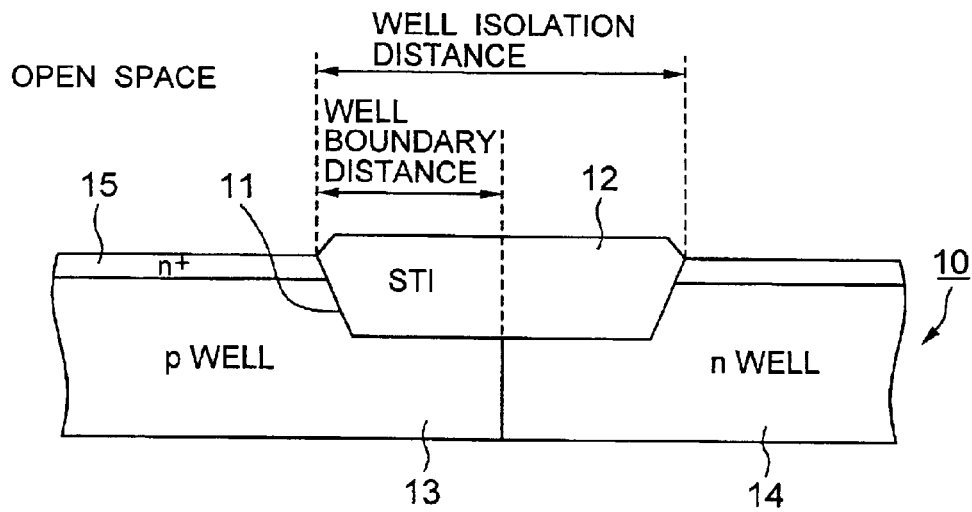
FIGS. 9A and 9B are cross-sectional views that explain an open space and a narrow space.
Figure 9B:
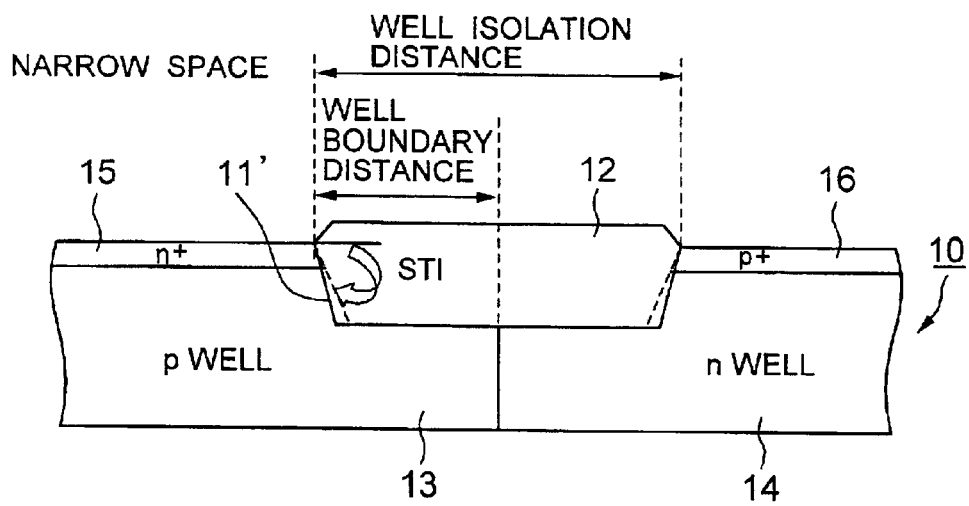
Figure 10:
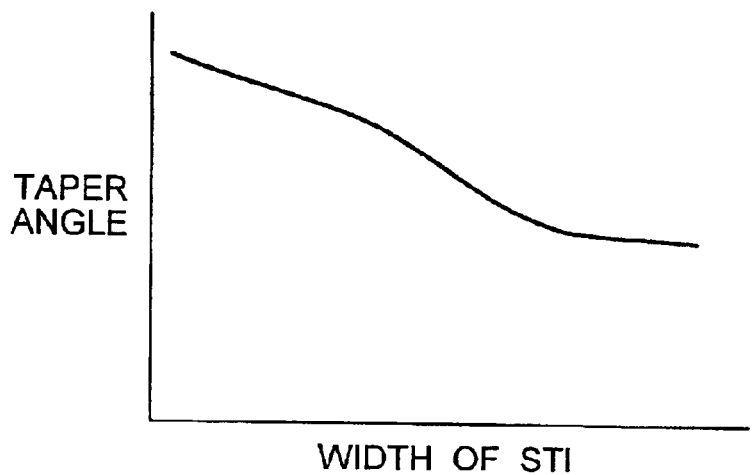
FIG. 10 is a graph that shows relations between STI width and tapered angle.
Figure 11:
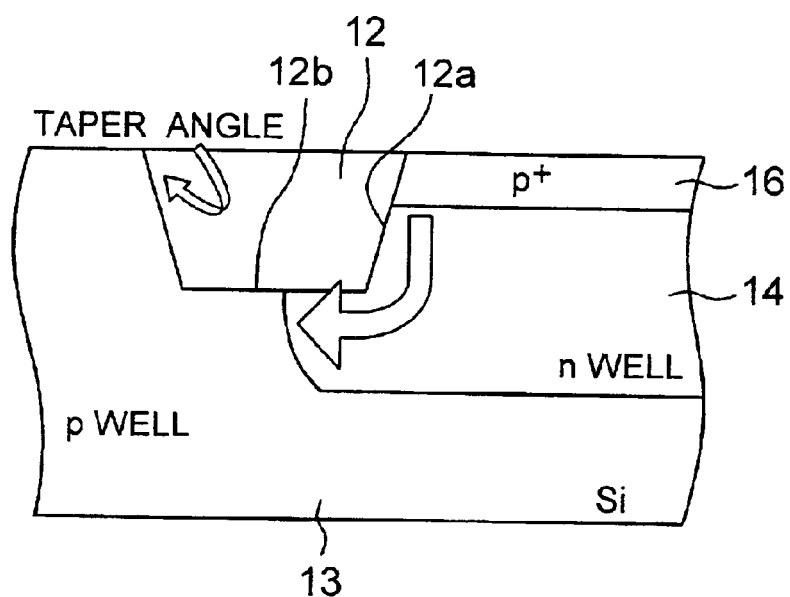
FIG. 11 is an explanatory diagram that shows property improvement by increasing the tapered angle.
Figure 12A:
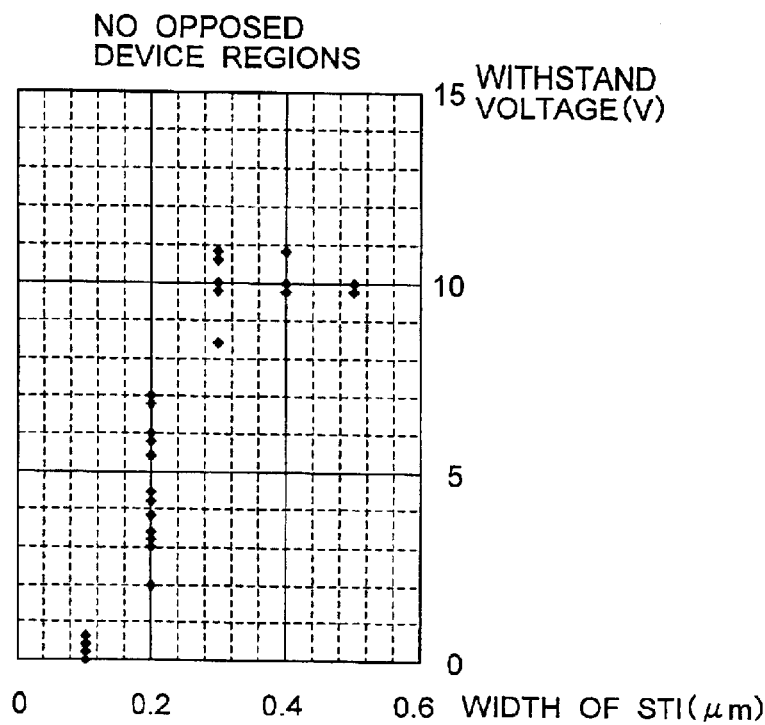
FIGS. 12A and 12B are graphs that show changes in withstand voltage property depending upon whether device regions are opposed or not.
Figure 12B:
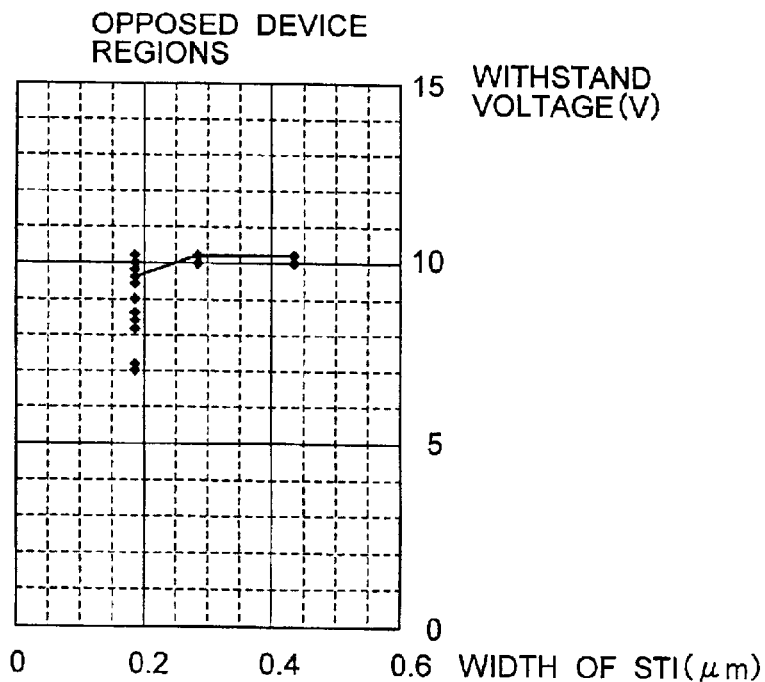

Some embodiments will now be explained below with reference to the drawings. In these embodiments, let the p-well 13 and the n-well 14 be in confrontation and contact under STI as shown in FIGS. 9A and 9B.

(1) Embodiment 1

Figure 1:
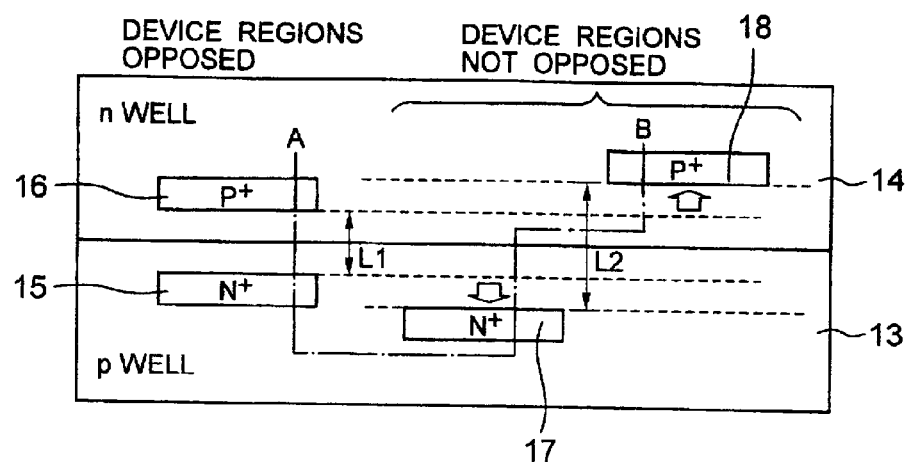
FIG. 1 is a plan view that shows the first embodiment of the invention.
Figure 2:
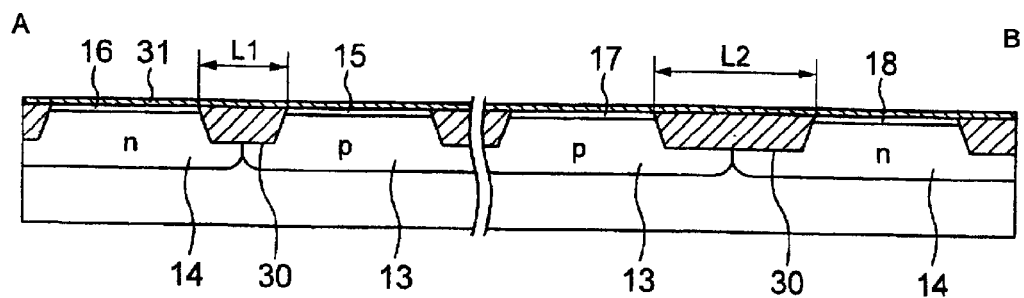
FIG. 2 comparatively shows the isolation distances for the cases where device regions are opposed and for the case where device regions are not opposed.

As shown in FIG. 1, device regions 15 and 16 are disposed in confrontation whereas regions 17 and 18 do not meet facing. In this case, since the device regions 15 and 16 meet facing, with their widths being completely equal, tapered angle of the STI side wall increases and creepage distance increases. Therefore, well isolation distance which is a first width L1 of the isolation structure 30 can be decreased. In contrast, in the device regions 17 and 18 out of confrontation, since tapered angle of the STI side wall leans more, a larger distance which is a second width L2 of the isolation structure 30 than this is required as the well isolation distance. FIG. 2 is a cross sectional drawing viewed along the line A-B. It would be understood from this figure that the isolation distance L1 (thickness of isolation 30) when device regions 16 and 15 are opposing is smaller than the isolation distance L2 when device regions 17 and 18 are not opposing.

Therefore, if all device regions are disposed in confrontation, devices can be made with a smaller well isolation distance than conventional ones, and miniaturization and integration of devices can be progressed.

Figure 3:
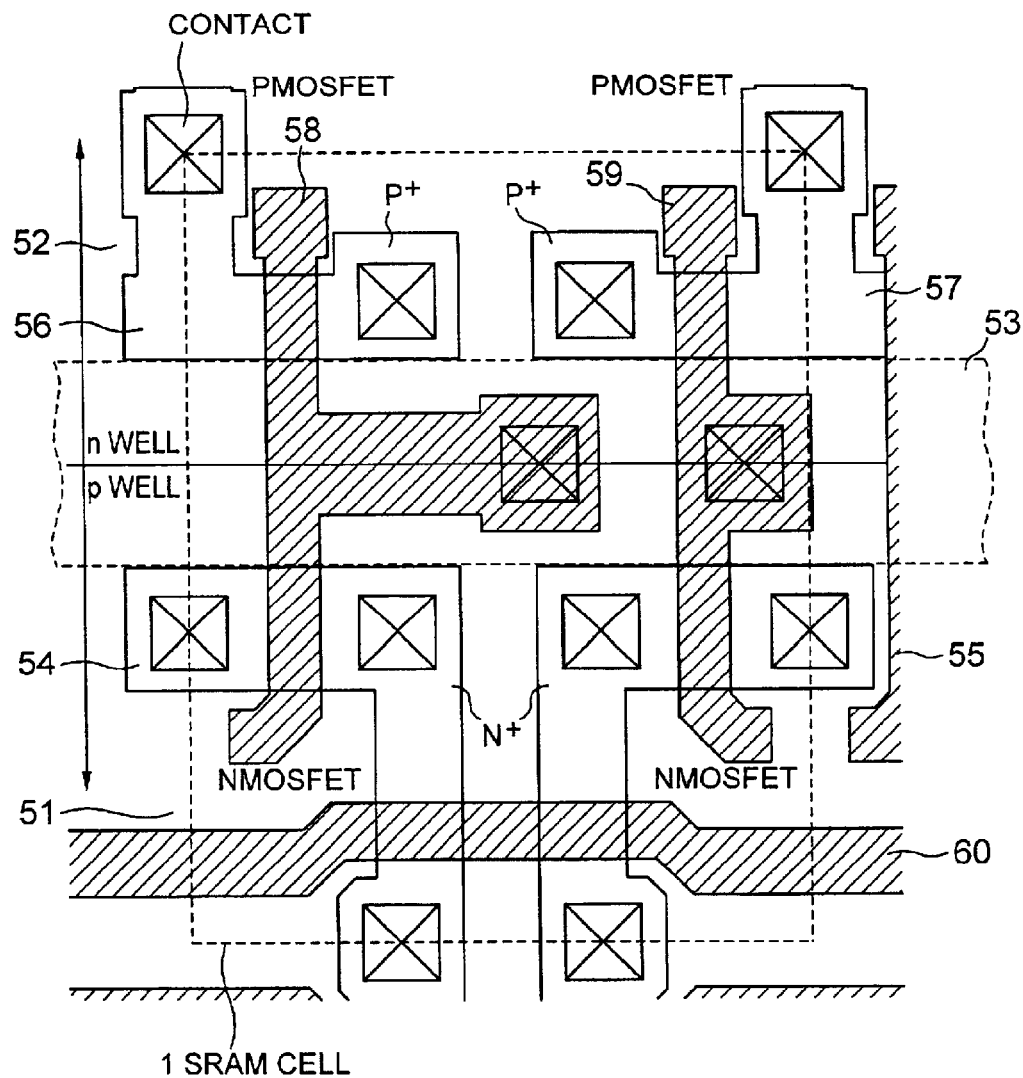
FIG. 3 is a plan view that shows a single cell of SRAM to which the configuration of FIG. 1 is applied.

As an example of this scheme, CMOS-type SRAM is shown. FIG. 3 is a plan view that shows a single cell of SRAM, which is made up of six CMOS (complementary MOS) transistors. A p-well 51 and an n-well 52 are formed in adjacent locations along a substrate surface, and STI 53 is formed on the their boundary. At opposite sides of STI, an n$^+$layer 54 and a p$^+$layer 56 are disposed to meet facing, and an n$^+$layer 55 and a p$^+$layer 57 are disposed similarly. Gate electrodes 58, 59, 60 are formed to extend transversely of those layers. Since respective opposed device regions coincide in width, width of STI 53 can be reduced smaller than those of conventional devices, and devices can be miniaturized, high-integrated and operative under a lower voltage as a whole.

(2) Embodiment 2

Figure 4:
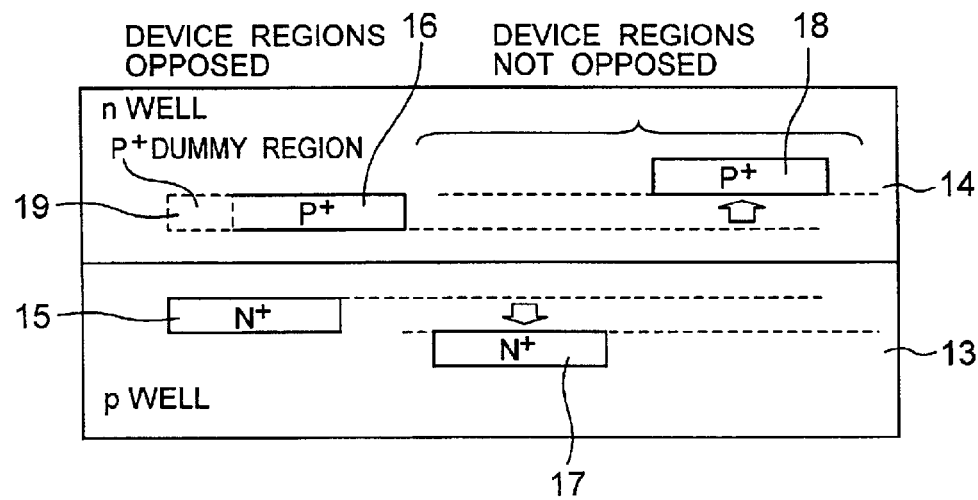
FIG. 4 is a plan view that shows the second embodiment of the invention.

As shown in FIG. 4, device regions 15 and 16 are partly opposed, but since their opposed extensions are not sufficiently wide, tapered angle does not increase sufficiently, and well isolation distance cannot be reduced sufficiently. To compensate it, a p$^+$dummy region 19 is formed to extend from one side of the p$^+$region 16 such that the n$^+$region 15 is opposed with its full width. As a result, similarly to the configuration of FIG. 1, there exists a pattern of opposed device regions, and miniaturization of devices can be attained by using more miniaturized well isolation.

(3) Embodiment 3

Figure 5:
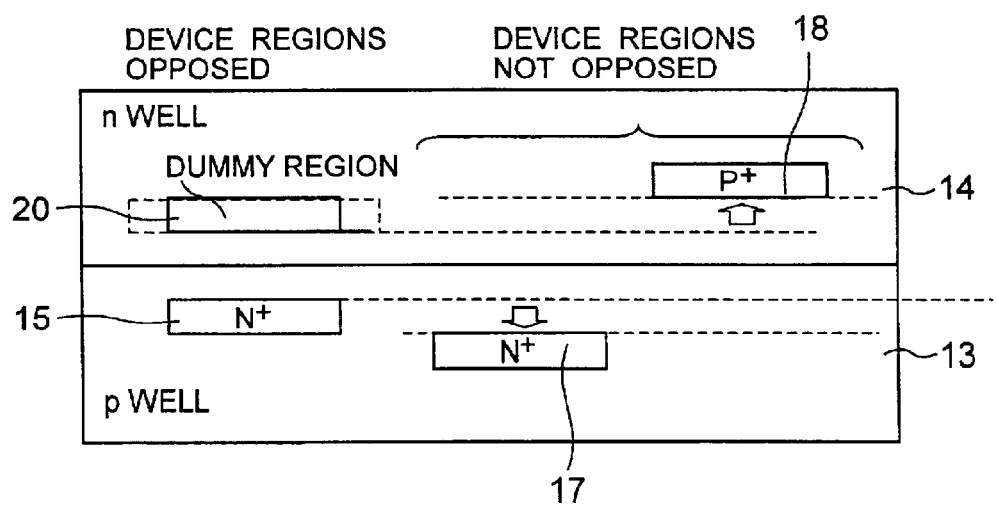
FIG. 5 is a plan view that shows the third embodiment of the invention.

If the concept of Embodiment 2 is used, opposed device regions need not be those actually used. That is, they may be dummy device regions. FIG. 5 shows an example of this concept, and a dummy pattern 20 is formed to confront the n$^+$region 15. Note, however, that its width has to completely include the portion opposed to the width of the n$^+$region 15. Therefore, if the dummy region has the width equal to the width of the n$^+$region 15 as illustrated with the solid line, or a wider width as illustrated with the broken line, the requirement is satisfied.

Figure 6:
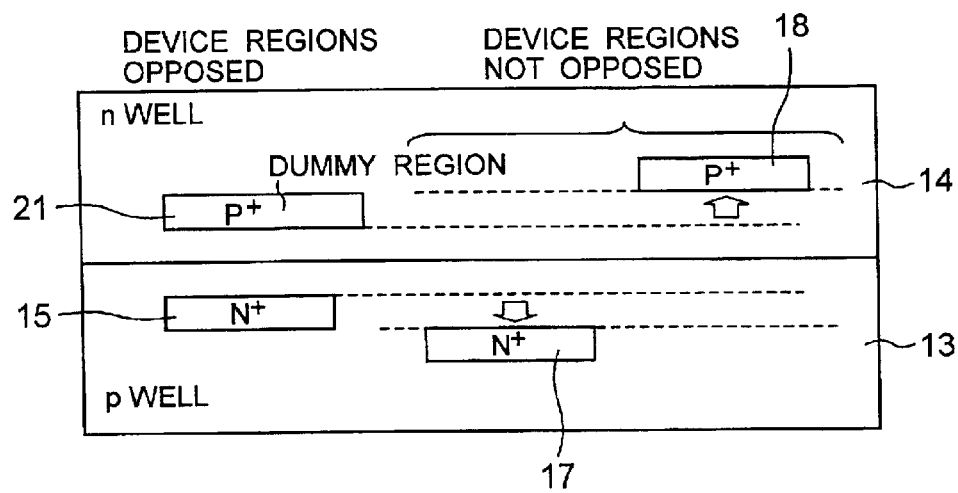
FIG. 6 is a plan view that shows an example based on the configuration of FIG. 5 and having a dummy region of the opposite conductivity type from that of the well.
Figure 7:
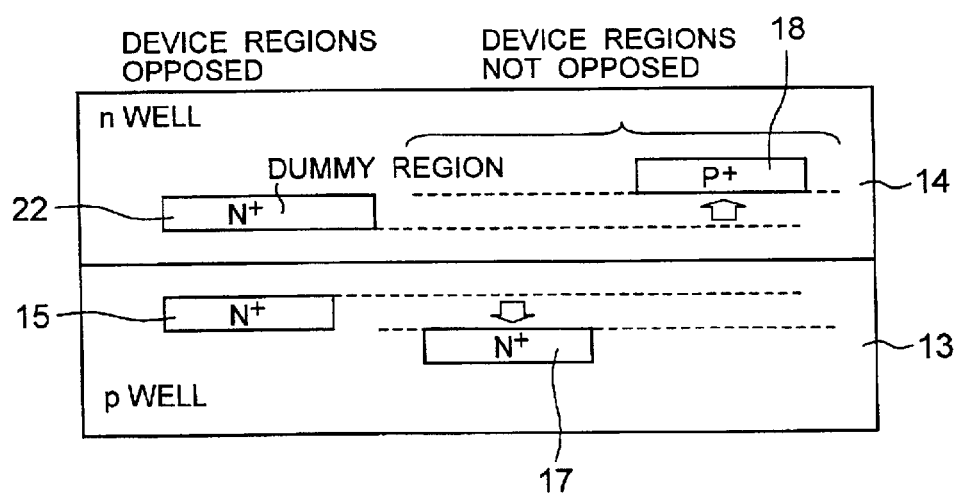
FIG. 7 is a plan view that shows an example based on the configuration of FIG. 5 and having a dummy region of the same conductivity type as that of the well.

FIG. 6 and FIG. 7 show examples thereof. In the example of FIG. 5, the p$^+$dummy region 21 includes the width of the n$^+$region 15 and it is wider than it. In the example of FIG. 7, the n$^+$dummy region 22 is similarly wider. In this manner, conductivity type of device regions may be either opposite from wells as in conventional devices or the same.

In case of the examples of FIGS. 5 through 7, well isolation width can be reduced by intentionally forming dummy regions in confrontation with device regions.

A manufacturing method of a semiconductor device employing the above-explained structure according to the invention is shown in FIGS. 8A through 8L.

Figure 8A:
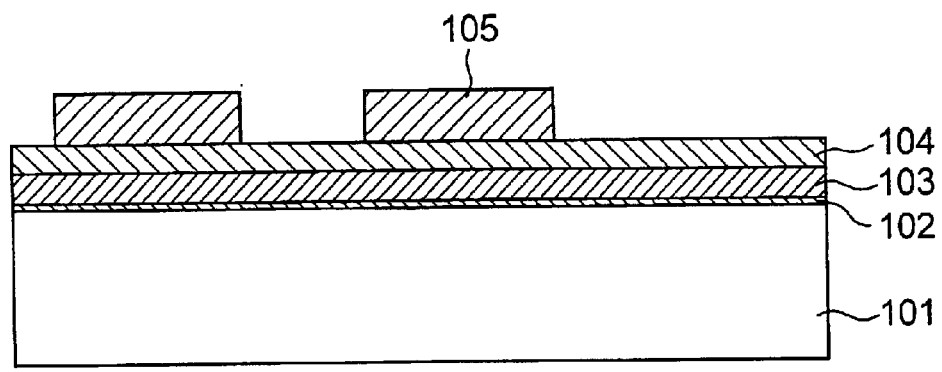
FIGS. 8A through 8L are cross-sectional views of a semiconductor device made by using the present invention, under different manufacturing steps.

First formed on a p-type Si substrate 101 is a SiO$_2$ film 102, 10 nm thick, for example, by thermal oxidation. Next formed thereon is a polycrystalline silicon film 103, 200 nm thick, by LP-CVD. Further formed thereon is a SiO$_2$ film 104, 200 nm thick, by LP-CVD. After that, a resist is coated, and a resist pattern 105 corresponding to device regions is formed by photo lithography (FIG. 8A).

Figure 8B:
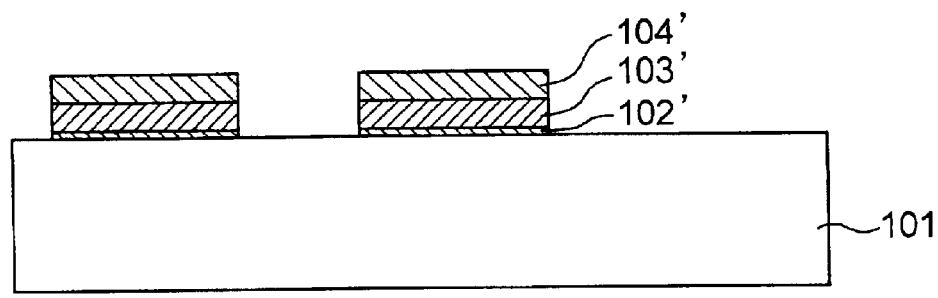

Using the resist pattern 105 as a mask, the SiO$_2$ film 104 is etched by anisotropic dry etching having a selectivity to the polycrystalline silicon film, and the resist 105 is removed. Using the SiO$_2$ film 104' obtained thereby as a mask, the polycrystalline silicon film 103 is etched by anisotropic dry etching ensuring a sufficient selectivity to an oxide film, thereby to obtain 103'. Again using the SiO$_2$ film 104' as a mask, the thermal oxide film SiO$_2$ 102 is etched to obtain the pattern shown by 102' (FIG. 8B).

Figure 8C:
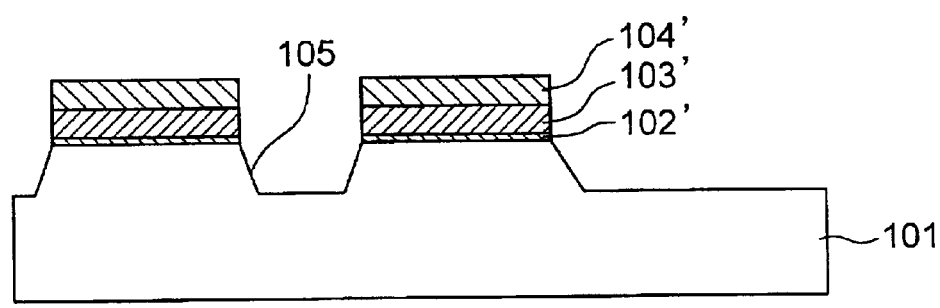

Using the multi-layered structure 102', 103', 104' as a mask, the Si substrate 101 is etched to the depth of 0.5 $\mu$m, for example, by anisotropic dry etching ensuring a sufficient selectivity to an oxide film, thereby to form a channel portion 105 of STI (FIG. 8C). Width of the channel is adjusted to be narrower when device regions are opposed at opposite sides of the channel than that of an open space in which device regions are not opposed.

Figure 8D:
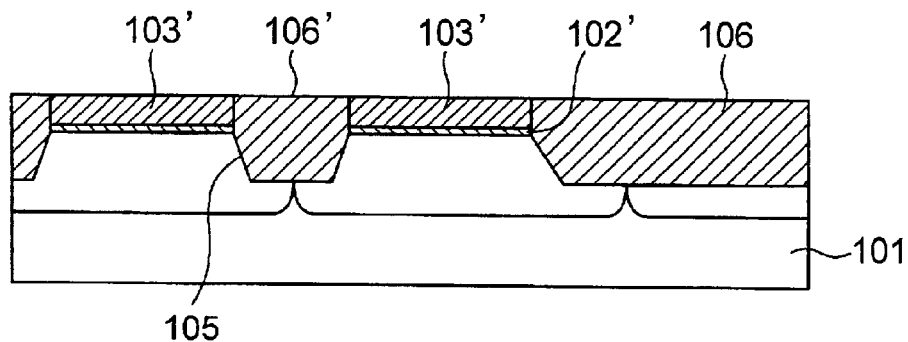
Figure 8E:
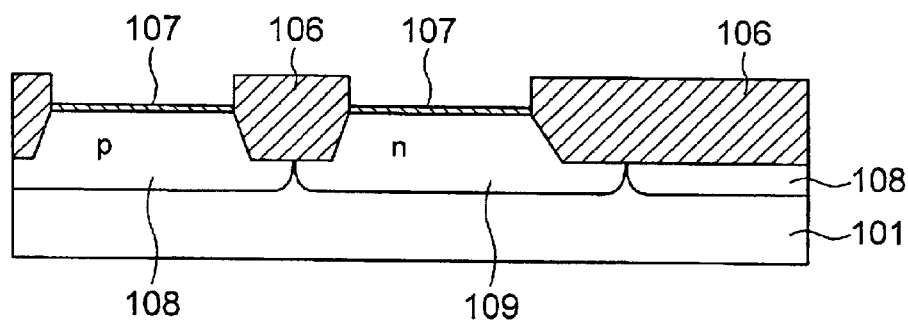

After that, a $SiO_2$ film 106 is deposited to the thickness of 1.5 μm by LP-CVD to fill the STI channel portion 105. Thereafter, the surface of the filled $SiO_2$ film 106 is flattened by chemical mechanical polishing ensuring a selectivity to polycrystalline silicon, and the $SiO_2$ film 104' is etched by $NH_4F$ or dry etching until the surface of the polycrystalline silicon film 103' is exposed (FIG. 8D).

Subsequently, the polycrystalline silicon film 103' is removed by isotropic dry etching ensuring a selectivity to $SiO_2$ film followed by annealing for reducing the stress of the filled oxide film 106 at, for example, 1000° C.

After that, the $SiO_2$ film 102' on the Si substrate is etched with $NH_4F$, and a $SiO_2$ film 107 is formed once again by thermal oxidation in, for example, 800° C. atmosphere. Then, boron for making p-well regions is implanted under the acceleration voltage of, for example, 200 KeV, by the dose of $8 \times 10^{12}$ cm$^{-2}$, B (boron) for controlling the threshold value of nMOSFET is implanted under the acceleration voltage of, for example, 50 KeV, by the dose of $1 \times 10^{13}$ cm$^{-2}$, phosphorus for forming n-well regions is implanted under the acceleration voltage of 500 KeV by the dose of $2 \times 10^{13}$ cm$^{-2}$, and phosphorus for controlling the threshold value of PMOSFET is implanted under the acceleration voltage of, for example, 200 KeV by the dose of $8 \times 10^{12}$ cm$^{-2}$. After that, implanted impurities are activated by annealing at 1000° C. for 30 seconds, thereby to form the p-well region 108 and the n-well region 109 (FIG. 7E).

Figure 8F:
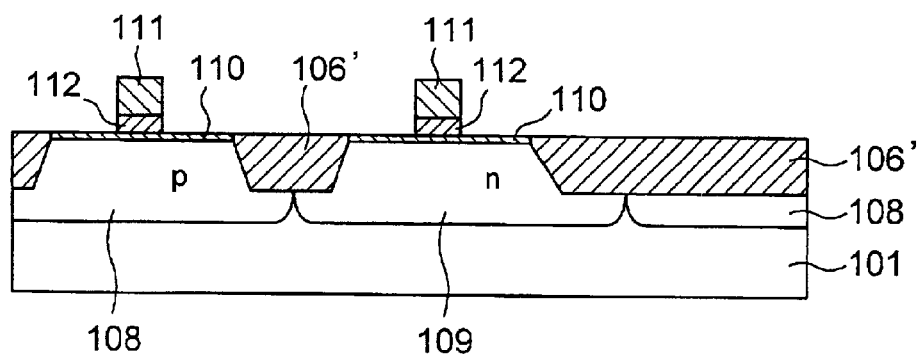

Subsequently, the filled oxide film 106 is thinned to the level of the top surface of the substrate as designated by 106', the thermal oxide film 107 is removed from the surface of the Si substrate, and the gate insulating film 110 is newly formed to the thickness of 6 nm by thermal oxidation of 750° C. Consecutively, polycrystalline silicon is stacked to the thickness of 300 nm by LP-CVD, a resist is coated to form a resist pattern 111 of gate electrodes by photo lithography, and using it as an etching mask, the gate electrode 112 is formed by anisotropic dry etching ensuring a sufficient selectivity to $SiO_2$ (FIG. 8F).

Figure 8G:
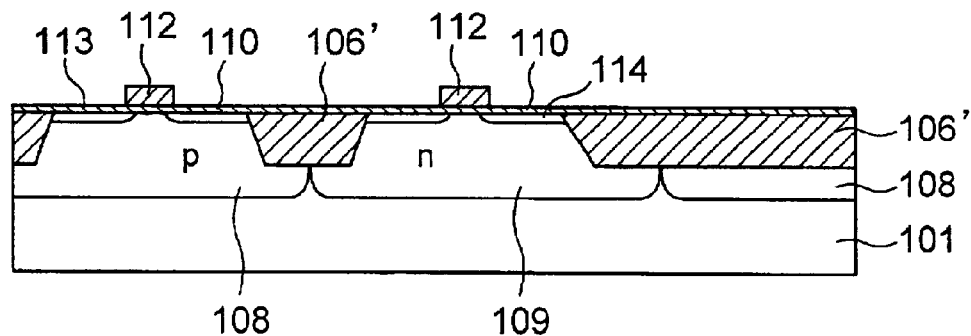

After that, 5 nm thick $SiO_2$ is formed on the Si substrate by thermal oxidation of 800 EC, and an ion implantation pattern is formed by photo lithography. There follows ion implantation of arsenic to n$^+$ regions under the acceleration voltage of 35 KeV by the dose of $2 \times 10^{14}$ cm$^{-2}$, and ion implantation of $BF_2$ to p$^+$ regions under the acceleration voltage of 10 KeV by the dose of $2 \times 10^{14}$ cm$^{-2}$. Subsequently, by annealing at 1000 EC for 30 seconds in $N_2$ atmosphere, a shallow n$^+$ layer 113 is formed in the p-well 108 and a shallow p$^+$ layer 114 is formed in the n-well (FIG. 8G).

Figure 8H:
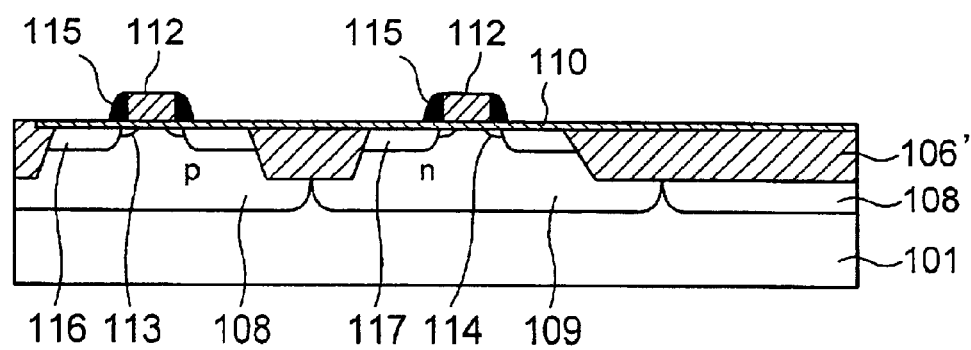

Subsequently, SiN is stacked to the thickness of 150 nm by LP-CVD, and it is etched by anisotropic etching ensuring an etching selectivity to $SiO_2$ to form a SiN side wall 115. Thereafter, an ion implantation pattern is formed by photo lithography, ion implantation is conducted to dope arsenic, for example, to n$^+$regions under the acceleration voltage of 60 KeV by the dose of $5 \times 10^{15}$ cm$^{-2}$ and to dope boron into p$^+$regions under the acceleration voltage of 10 KeV by the dose of $5 \times 10^{15}$ cm$^{-2}$. Then, by annealing at 1000° C. for 30 seconds in $N_2$ atmosphere, deep n$^+$source/drain diffusion layer 116 and deep p$^+$source/drain diffusion layer 117 are formed, and the gate electrode 112 is doped to n$^+$conductivity (FIG. 8H).

Figure 8I:
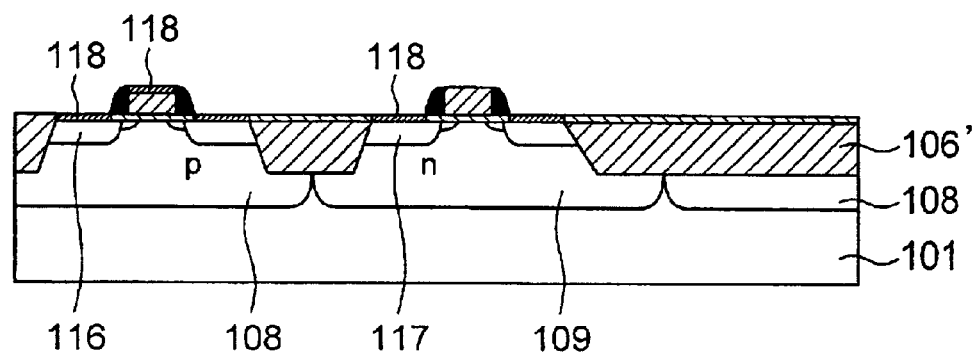

Subsequently, $SiO_2$ on the source/drain of MOSFET and the gate electrode is removed with $NH_4F$, and Ti/TiN films, for example, are stacked to the thicknesses of 30/20 nm, respectively, as refractory metals having high melting points in order to decrease the resistance. Consecutively, annealing is conducted at 700° C. for 30 seconds in $N_2$ atmosphere, and Ti not having reacted on Si is removed in a mixed liquid of sulfuric acid and hydrogen peroxide solution. Thereafter, annealing is conducted at 800° C. for 30 seconds in $N_2$ atmosphere to form a low-resistance Ti silicide compound 118 (FIG. 8I).

Figure 8J:
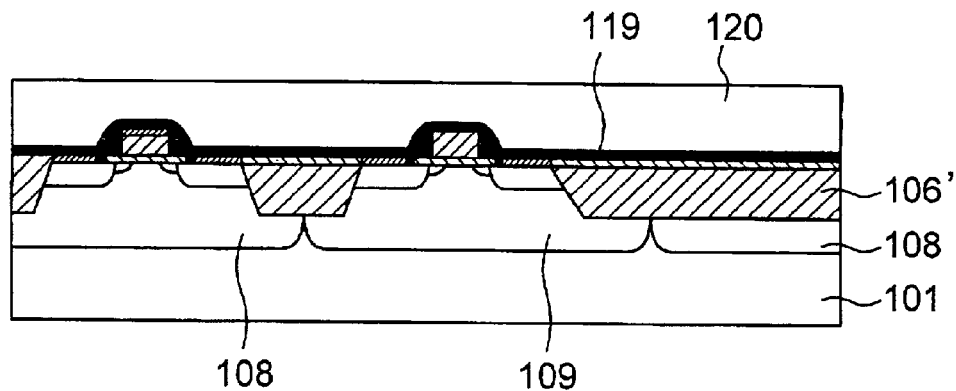

Subsequently, using LP-CVD, SiN 119, 100 nm thick, and an inter-layer insulating film 120 of BPSG or $SiO_2$, 900 nm thick, are stacked, followed by leveling by CMP (chemical mechanical polishing) (FIG. 8J).

Figure 8K:
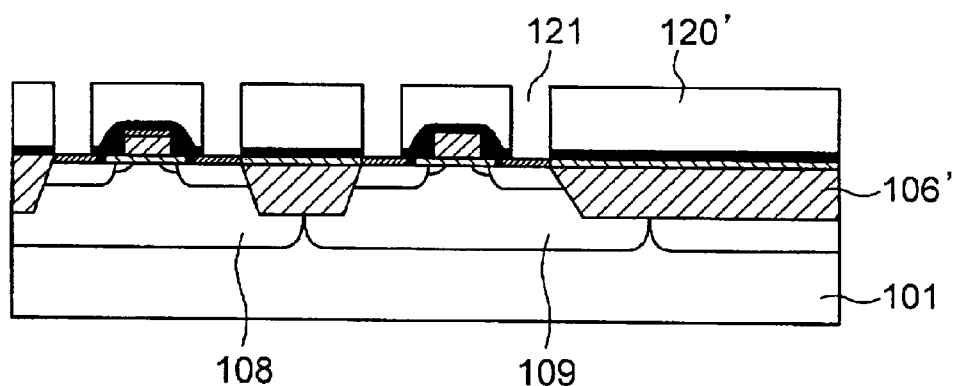

Thereafter, a resist pattern for contacts is formed by photo lithography, and an opening 121 is formed in the BPSG/$SiO_2$ film by anisotropic etching ensuring an etching selectivity to SiN 119. After that, SiN 119 is solely etched selectively under anisotropic etching conditions ensuring an etching selectivity to $SiO_2$ (FIG. 8K).

Figure 8L:
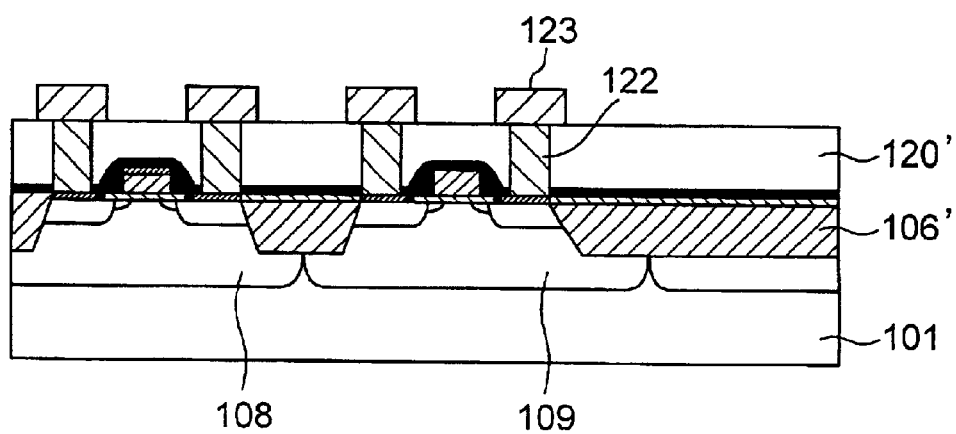

After that, Ti, for example, is sputtered to accumulate by 10 nm at the bottom portion of the contact. Then, in $N_2$ atmosphere controlled at 600° C., for example, annealing is conducted for 30 minutes to form TiN on the Ti surface. Thereafter, W (tungsten) 122 is deposited to the thickness of 400 nm by CVD, part of W on BPSG is next removed by CMP to fill the contact opening with W. After that, 400 nm of AlCu, ⅝₀ nm o Ti/TiN are deposited, a resist pattern is formed by photo lithography, and using it as a mask, Al interconnection 123 is formed by anisotropic etching (FIG. 8L). Through these steps, the semiconductor device is completed.

As described above, according to the invention, by opposing device regions well-isolated by STI and thereby increasing the tapered angle of the STI side wall, well isolation property can be improved as compared with structures without opposed device regions.

In case that opposed device regions are cell patterns of static RAM, device regions equal in size are opposed, and miniaturization can be promoted than other circuit blocks.

One of two opposed device regions may be a dummy device region unnecessary for the actual circuit, and it enables fine well isolation.

The dummy device region does not adversely affects electrically even whichever conductivity type it has, either the same as or opposite from the conductivity type of the well in which it is formed, and fine well isolation is possible.

In case that opposed device regions do not coincide in width and at least one of them needs a fine device isolation structure, STI tapered angle can be increased by adjusting the width of the other device region to include the full width of the former device region, and fine well isolation is possible as well.

What is claimed is:
1. A semiconductor device comprising:
a first well of a first conductivity type and a second well of a second conductivity type opposite to the first conductivity type, said first and second wells being disposed adjacent to each other;

a straight well isolation structure comprising a shallow trench formed on a boundary of said first and second wells;

a first device region of the second conductivity type provided in said first well;

a second device region of the first conductivity type provided in said second well, said first and second device regions being disposed to oppose each other face-to-face, with a first section of said well isolation structure disposed between said first and second device regions;

a third device region of the second conductivity type provided in said first well, said third device region being positioned separately from and adjacent to said first device region;

a fourth device region of the first conductivity type provided in said second well, said third and fourth device regions being disposed not to oppose each other face-to-face, with a second section of said well isolation structure disposed between said third and fourth device regions, said fourth device region being positioned separately from and adjacent to said second device region;

wherein said second section of said well isolation structure is wider than said first section of said well isolation structure.

2. The semiconductor device according to claim 1, wherein said first, second, third and fourth device regions have a substantially same shape.

3. A semiconductor device comprising:

a first well of p type and a second well of n type disposed adjacent to each other;

a straight well isolation structure comprising a shallow trench formed on a boundary of said first and second wells;

a pair of a first device region of n type and a second device region of p type, said first and second device regions being disposed to oppose each other face-to-face, with a first section of said well isolation structure disposed between said first device region and said second device region;

a third device region of n type and fourth device region of p type, said third and fourth device regions being disposed not to oppose each other face-to-face, with a second section of said well isolation structure disposed between said third device region and said fourth device region;

wherein said first and third device regions are adjacent to each other and separately positioned in said first well, and said second and fourth device regions are adjacent to each other and separately positioned in said second well, and said second section of said well isolation structure is wider than a said first section of said well isolation structure.

* * * * *